US010903049B2

United States Patent
Higuchi

(10) Patent No.: US 10,903,049 B2
(45) Date of Patent: Jan. 26, 2021

(54) PLASMA PROCESSING APPARATUS AND MEASUREMENT CIRCUIT

(71) Applicant: Tokyo Electron Limited, Tokyo (JP)

(72) Inventor: Ryuta Higuchi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/156,092

(22) Filed: Oct. 10, 2018

(65) Prior Publication Data

US 2019/0108979 A1 Apr. 11, 2019

(30) Foreign Application Priority Data

Oct. 10, 2017 (JP) .................................. 2017-196786
Jul. 20, 2018 (JP) .................................. 2018-136326

(51) Int. Cl.
*H01J 37/32* (2006.01)
*H01L 21/67* (2006.01)
*H03G 3/30* (2006.01)

(52) U.S. Cl.
CPC .. *H01J 37/32183* (2013.01); *H01L 21/67069* (2013.01); *H01J 2237/24495* (2013.01); *H01J 2237/24564* (2013.01); *H01J 2237/334* (2013.01); *H03G 3/30* (2013.01); *H03G 3/3036* (2013.01)

(58) Field of Classification Search
CPC ....... H01J 37/32183; H01J 2237/24495; H01J 2237/24564; H01J 2237/334; H01L 21/67069; H01L 2223/6655
See application file for complete search history.

(56) References Cited

U.S. PATENT DOCUMENTS

| | | | | |
|---|---|---|---|---|
| 5,997,687 A | * | 12/1999 | Koshimizu | ....... H01J 37/32082 156/345.44 |
| 2011/0234201 A1 | * | 9/2011 | Tanaka | .............. H01J 37/32183 324/76.39 |
| 2011/0291771 A1 | * | 12/2011 | Shannon | .................. H03H 7/38 333/124 |

(Continued)

FOREIGN PATENT DOCUMENTS

| | | |
|---|---|---|
| CN | 105321792 A | 2/2016 |
| JP | H10-064696 A | 3/1998 |
| JP | 2017-073247 A | 4/2017 |

*Primary Examiner* — Borna Alaeddini
(74) *Attorney, Agent, or Firm* — Pearne & Gordon LLP

(57) ABSTRACT

A plasma processing apparatus 10 includes a chamber 17 in which an internal space is provided and a target object carried into the internal space is processed with plasma in the internal space; a high frequency power source 14 configured to supply a high frequency power for plasma generation within the chamber 17; a matching circuit 15 configured to match an impedance of the plasma within the chamber 17 with an impedance of the high frequency power source 14; a signal synchronizer 20 configured to calculate the impedance of the plasma within the chamber 17; a control amount calculator 12 configured to control a frequency and a magnitude of the high frequency power, and an impedance of the matching circuit 15 based on the impedance calculated by the signal synchronizer 20. Further, the signal synchronizer 20 and the control amount calculator 12 are provided on a single substrate 11.

12 Claims, 8 Drawing Sheets

(56) References Cited

U.S. PATENT DOCUMENTS

| | | | |
|---|---|---|---|
| 2013/0119863 A1* | 5/2013 | Hanawa | H01J 37/32091 |
| | | | 315/111.21 |
| 2015/0000841 A1* | 1/2015 | Yamada | H01J 37/32091 |
| | | | 156/345.28 |
| 2015/0348854 A1 | 12/2015 | Kapoor et al. | |
| 2017/0092468 A1* | 3/2017 | Shiina | H01J 37/32165 |

* cited by examiner

PLASMA PROCESSING APPARATUS AND MEASUREMENT CIRCUIT

CROSS-REFERENCE TO RELATED APPLICATION

This application claims the benefit of Japanese Patent Application Nos. 2017-196786 and 2018-136326 filed on Oct. 10, 2017 and Jul. 20, 2018, respectively, the entire disclosures of which are incorporated herein by reference.

TECHNICAL FIELD

The embodiments described herein pertain generally to a plasma processing apparatus and a measurement circuit.

BACKGROUND

In an etching process of a semiconductor wafer with plasma, it is important to control a hole or a groove formed by the etching to have a desired shape. The shape of the hole or the groove formed by the etching is affected by a ratio of radicals to ions in the plasma, or the like. The ratio of radicals to ions in the plasma is controlled with, e.g., a magnitude or a frequency of a high frequency power supplied to the plasma. Further, the ratio of radicals to ions in the plasma can be controlled with high accuracy by pulse-modulating the high frequency power supplied to the plasma.

When the pulse-modulated high frequency power is applied to the plasma, it is required to perform impedance matching between a high frequency power source and the plasma at a high speed, following a rapid increase and decrease caused by the pulse modulation. As a method for performing the impedance matching at the high speed, there has been considered that the impedance matching between the high frequency power source and the plasma is performed at the high speed by adjusting the frequency of the high frequency power source.

Patent Document 1: Japanese Patent Laid-open Publication No. H10-064696

Patent Document 2: Japanese Patent Laid-open Publication No. 2017-073247

SUMMARY

However, depending on the processing conditions or the state of a chamber, plasma may be extinguished or may become unstable. In a conventional plasma processing apparatus, a high frequency power source controls the power and matching frequency, and a matcher controls the impedance, and the high frequency power source and the matcher do not cooperate with each other but perform the processings independently of each other. For this reason, the controls performed by the high frequency power source and the matcher may interfere with each other, which may cause a controlled oscillation. Therefore, plasma may be extinguished or may become unstable.

As one of methods for solving this problem, there has been considered a method of loosening the controls by, for example, applying filters to sensing amounts used for the respective controls. However, in this method, a controlled oscillation may not be completely suppressed depending on conditions. Further, in the conventional plasma processing apparatus, it takes some time to perform matching processing. Therefore, if the high frequency power is modulated with a short periodic pulse, the matching processing may not be ended within a pulse-on period and reflection waves may remain. For this reason, if the pulse modulation is performed in multiple plasma processing apparatuses, the level of reflection waves cannot be controlled, and, thus, there may be an apparatus error.

For this reason, there has been a demand for a plasma processing apparatus capable of completing impedance matching processing in a short time and thus rapidly igniting stable plasma even when using high frequency power modulated with a short periodic pulse.

In one exemplary embodiment, there is provided a plasma processing apparatus including a chamber, a power supply unit, a matching circuit, a first calculator, and a control circuit. The chamber has an internal space and a processing target object carried into the internal space is processed with plasma generated in the internal space. The power supply unit is configured to supply a high frequency power for plasma generation within the chamber. The matching circuit is configured to match an impedance of the plasma within the chamber with an impedance of the power supply unit. The first calculator is configured to calculate the impedance of the plasma within the chamber. The control circuit is configured to control a frequency of the high frequency power supplied into the chamber, a magnitude of the high frequency power, and an impedance of the matching circuit based on the impedance calculated by the first calculator. Further, the first calculator and the control circuit are provided on a single substrate.

There is provided a plasma processing apparatus including a chamber, a power supply unit, a matching circuit, a first calculator, and a control circuit. The chamber has an internal space and a processing target object carried into the internal space is processed with plasma generated in the internal space. The power supply unit is configured to supply a high frequency power for plasma generation within the chamber. The matching circuit is configured to match an impedance of the plasma within the chamber with an impedance of the power supply unit. The first calculator is configured to calculate the impedance of the plasma within the chamber. The control circuit is configured to control a frequency of the high frequency power supplied into the chamber, a magnitude of the high frequency power, and an impedance of the matching circuit based on the impedance calculated by the first calculator. Further, the first calculator and the control circuit are provided on a single substrate.

The plasma processing apparatus may further include a first measurement unit connected to a node between the matching circuit and the chamber and configured to measure a voltage and a current of the high frequency power supplied into the chamber. The first calculator may calculate the impedance of the plasma within the chamber based on the voltage and the current of the high frequency power measured by the first measurement unit.

The first calculator may include a first analog to digital converter (ADC), a second ADC, a second calculator and a third calculator. The first ADC is configured to convert a voltage of the high frequency power supplied into the chamber into a digital signal. The second ADC is configured to convert a current of the high frequency power supplied into the chamber into a digital signal. The second calculator is configured to calculate a phase and an amplitude of the voltage converted into the digital signal and a phase and an amplitude of the current converted into the digital signal. The third calculator is configured to calculate the impedance of the plasma within the chamber based on a phase difference and an amplitude ratio between the voltage converted into the digital signal and the current converted into the digital signal.

The first calculator may further include a signal generator, a first phase adjusting unit and a second phase adjusting unit. The signal generator is configured to generate a sampling clock input into each of the first ADC and the second ADC. The first phase adjusting unit is configured to adjust a phase of the sampling clock input into the first ADC based on the phase of the voltage corresponding to the sampling clock. The second phase adjusting unit is configured to adjust a phase of the sampling clock input into the second ADC based on the phase of the current corresponding to the sampling clock.

The first calculator may further include a first amplifier, a second amplifier, a first gain adjusting unit and a second gain adjusting unit. The first amplifier is configured to amplify the voltage of the high frequency power supplied into the chamber and input the amplified voltage into the first ADC. The second amplifier is configured to amplify the current of the high frequency power supplied into the chamber and input the amplified current into the second ADC. The first gain adjusting unit is configured to adjust a gain of the first amplifier based on the amplitude of the voltage calculated by the second calculator. The second gain adjusting unit is configured to adjust a gain of the second amplifier based on the amplitude of the current calculated by the second calculator.

The plasma processing apparatus may further include a second measurement unit connected to a node between the power supply unit and the matching circuit and configured to measure a voltage and a current of a high frequency power output from the power supply unit into the matching circuit. The first calculator may calculate the impedance of the plasma within the chamber by further using the voltage and the current of the high frequency power measured by the second measurement unit.

A measurement circuit is provided in a plasma processing apparatus including a chamber in which an internal space is provided and a processing target object carried into the internal space is processed with plasma generated in the internal space; a power supply unit configured to supply a high frequency power for plasma generation within the chamber; a matching circuit provided between the chamber and the power supply unit; and a control circuit configured to control a frequency of the high frequency power supplied into the chamber by the power supply unit, a magnitude of the high frequency power, and an impedance of the matching circuit and is configured to measure an impedance of the plasma within the chamber. The measurement circuit is provided on a single substrate together with the control circuit. The measurement circuit includes a first ADC, a second ADC, an amplitude/phase calculator and an impedance calculator. The first ADC is configured to convert a voltage of the high frequency power supplied into the chamber into a digital signal. The second ADC is configured to convert a current of the high frequency power supplied into the chamber into a digital signal. The amplitude/phase calculator is configured to calculate a phase and an amplitude of the voltage converted into the digital signal and a phase and an amplitude of the current converted into the digital signal. The impedance calculator is configured to calculate the impedance of the plasma within the chamber based on a phase difference and an amplitude ratio between the voltage converted into the digital signal and the current converted into the digital signal.

According to the exemplary embodiment, even when high frequency power modulated with a short periodic pulse is used, impedance matching processing can be completed in a short time, and, thus, stable plasma can be rapidly ignited.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
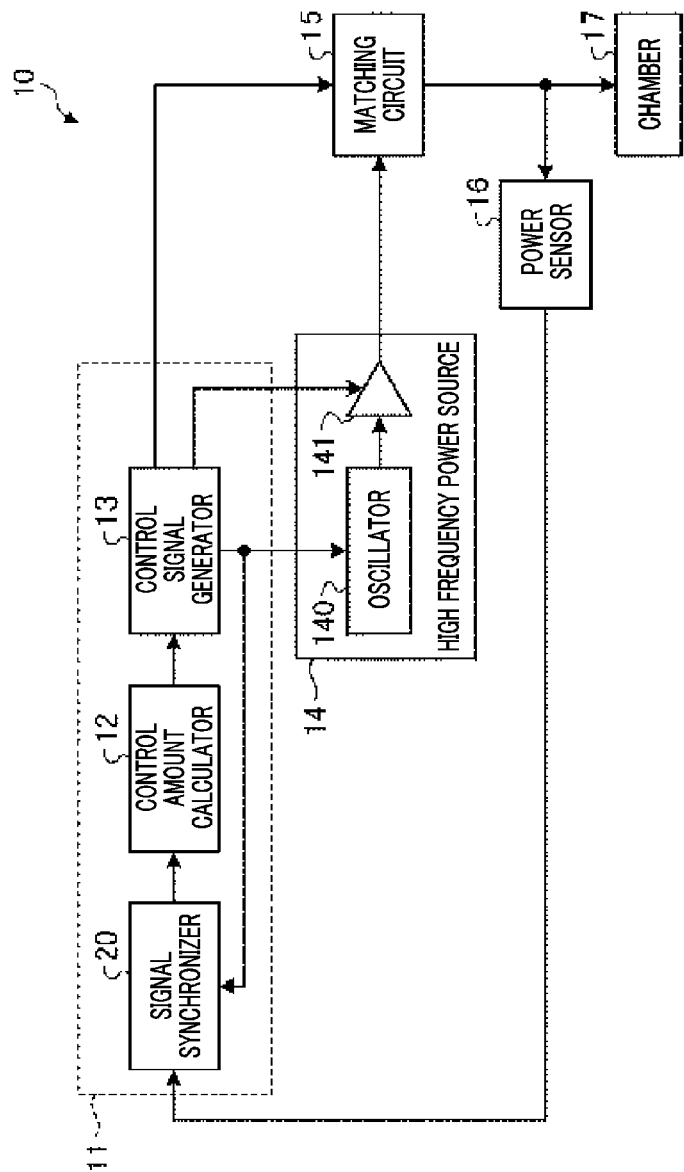
FIG. 1 is a block diagram showing an example of a plasma processing apparatus according to an exemplary embodiment 1.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Exemplary embodiments of the plasma processing apparatus and the measurement circuit disclosed herein will be described in detail with reference to the accompanying drawings. The plasma processing apparatus and the measurement circuit disclosed herein are not limited to each of the following exemplary embodiments.

Exemplary Embodiment 1

[Configuration of Plasma Processing Apparatus 10]

FIG. 1 is a block diagram showing an example of a plasma processing apparatus according to an exemplary embodiment 1. The plasma processing apparatus 10 is equipped with, for example, a signal synchronizer 20, a control amount calculator 12, a control signal generator 13, a high frequency power source 14, a matching circuit 15, a power sensor 16, and a chamber 17, as shown in FIG. 1. In the present exemplary embodiment, the signal synchronizer 20, the control amount calculator 12, and the control signal generator 13 are actually provided on a single substrate 11.

The high frequency power source 14 is equipped with an oscillator 140 and an amplifier 141. The oscillator 140 is configured to generate a high frequency power depending on a control signal output from the control signal generator 13. The amplifier 141 is configured to amplify the high frequency power generated by the oscillator 140 with a gain depending on a control signal output from the control signal generator 13. The high frequency power amplified by the amplifier 141 is supplied into the chamber 17 through the matching circuit 15. The high frequency power source 14 is an example of a power supply unit.

The chamber 17 has an internal space, and a processing target object such as a semiconductor wafer or the like is accommodated in the internal space. The inside of the chamber 17 is exhausted to a predetermined vacuum level by a non-illustrated exhaust device, and a processing gas is supplied into the chamber 17 from a non-illustrated gas supply source. Further, since the high frequency power output from the high frequency power source 14 is supplied to the chamber 17 through the matching circuit 15, plasma of the processing gas is generated within the chamber 17 and a predetermined processing such as etching is performed to the processing target object within the chamber 17 with the generated plasma.

The matching circuit 15 is configured to match an impedance of the high frequency power source 14 with an impedance of the chamber 17 containing the plasma. The matching circuit 15 includes therein an inductor and multiple variable capacitance capacitors, and controls a capacitance of each of the variable capacitance capacitors in response to a control signal output from the control signal generator 13. Further, the matching circuit 15 may include a variable inductor whose inductance can be varied. An input impedance of the matching circuit 15 varies depending on the state of the plasma generated within the chamber 17. The matching circuit 15 matches an output impedance of the high frequency power source 14 with an input impedance of the matching circuit 15 by controlling a capacitance of each of the variable capacitance capacitors in response to a control signal output from the control signal generator 13.

The power sensor 16 is connected to a node between the matching circuit 15 and the chamber 17 on a transmission path for the high frequency power output from the high frequency power source 14 and supplied into the chamber 17 through the matching circuit 15. The power sensor 16 is configured to measure a voltage and a current of the high frequency power supplied into the chamber 17 through the matching circuit 15 and configured to output the measurement result of the voltage and the current to the signal synchronizer 20. The power sensor 16 is an example of a first measurement unit.

The signal synchronizer 20 is configured to calculate the impedance of the chamber 17 including an impedance of the plasma generated within the chamber 17 based on the measurement result of the voltage and the current of the high frequency power output from the power sensor 16 and a control signal output from the control signal generator 13. Further, the signal synchronizer 20 is configured to output the calculated impedance of the chamber 17 to the control amount calculator 12. The signal synchronizer 20 is an example of a first calculator.

The control amount calculator 12 is configured to calculate a current input impedance of the matching circuit 15 based on the impedance of the chamber 17 calculated by the signal synchronizer 20. Further, the control amount calculator 12 is configured to calculate control amounts of respective parameters such as a frequency of the high frequency power, a magnitude of the high frequency power, and capacitances of the respective variable capacitance capacitors within the matching circuit 15 to allow the input impedance of the matching circuit 15 to reach a target input impedance (e.g., 50Ω).

Herein, an input impedance Z1 of the matching circuit 15 is calculated by using the parameters $x_n$ such as the frequency of the high frequency power, the magnitude of the high frequency power, and the capacitances of the respective variable capacitance capacitors within the matching circuit 15 based on, for example, the following a model equation (1).

$$Z1 = f(x_1, x_2, \ldots, x_n) \tag{1}$$

Further, the parameters $x_n$ may include, for example, a temperature and a pressure within the chamber 17 and a kind of a gas supplied into the chamber 17 in addition to the frequency of the high frequency power, the magnitude of the high frequency power, and the capacitances of the respective variable capacitance capacitors within the matching circuit 15.

The control amount calculator 12 is configured to calculate the control amounts of the respective parameters $x_n$ to allow the input impedance of the matching circuit 15 to reach the target input impedance based on the model equation (1). In the present exemplary embodiment, the control amount calculator 12 calculates the control amounts of the frequency of the high frequency power, the magnitude of the high frequency power, and the capacitances of the respective variable capacitance capacitors within the matching circuit 15. Then, the control amount calculator 12 outputs the calculated control amounts to the control signal generator 13.

The control signal generator 13 is configured to generate control signals for the respective control amounts of the frequency of the high frequency power, the magnitude of the high frequency power, and the capacitances of the respective variable capacitance capacitors within the matching circuit 15 output from the control amount calculator 12. Then, the control signal generator 13 outputs the generated control signals to the oscillator 140, the amplifier 141, and the matching circuit 15, respectively. The control amount calculator 12 and the control signal generator 13 are examples of a control circuit.

Herein, the impedance of the plasma varies depending on the state of the plasma within the chamber 17 from before the ignition of the plasma until the plasma becomes stable after the ignition of the plasma. For this reason, if the input impedance of the matching circuit 15 reaches the target input impedance at one time by using the model equation (1), the control becomes excessive so that the controlled oscillation may be generated. For this reason, in the present exemplary embodiment, a predetermined trajectory for the input impedance of the matching circuit 15 to reach the target input impedance is defined on a Smith chart. Further, the control amount calculator 12 specifies an impedance at which the current input impedance of the matching circuit 15 becomes approximate to the target input impedance, on the trajectory. Then, the control amount calculator 12 calculates the control amounts of the respective parameters to set the current input impedance of the matching circuit 15 to the specified impedance by using the model equation (1). Accordingly, the control amount calculator 12 can match the output impedance of the high frequency power source 14 with the input impedance of the matching circuit 15 in a short time while suppressing the controlled oscillation.

Further, the control amount calculator 12 controls the input impedance of the matching circuit 15 to pass through the previously defined trajectory on the Smith chart and thus can change the input impedance of the matching circuit 15 in the same manner even in another plasma processing apparatus 10. For this reason, it is possible to suppress a difference in time required for the matching processing in different plasma processing apparatuses 10.

Furthermore, the control amount calculator 12 calculates the control amounts of the frequency of the high frequency power, the magnitude of the high frequency power, the capacitances of the respective variable capacitance capacitors within the matching circuit 15, and the like by commonly using the impedance of the chamber 17 calculated by the signal synchronizer 20. Accordingly, the control amount calculator 12 can adjust the input impedance of the matching circuit 15 based on the impedance of the chamber 17 measured at the same timing. As a result, the controlled oscillation can be suppressed, and, thus, the plasma can be stably generated.

Moreover, the control amount calculator 12 calculates the control amounts of the parameters such as the frequency of the high frequency power, the magnitude of the high frequency power, and the capacitances of the respective variable capacitance capacitors within the matching circuit 15 by using the model equation (1). For this reason, the controlled oscillation can be suppressed as compared to the case where each parameter is individually calculated. Accordingly, it is possible to make the input impedance of the matching circuit 15 converge to the target input impedance in a short time.

Further, in the present exemplary embodiment, the signal synchronizer 20, the control amount calculator 12, and the control signal generator 13 are actually provided on the single substrate 11. Therefore, communication among substrates is not needed as compared to the case where the signal synchronizer 20, the control amount calculator 12, and the control signal generator 13 are actually provided on different substrates, respectively. Accordingly, a delay of the control signal accompanied by the communication among substrates can be reduced, and the control amount calculator 12 and the control signal generator 13 can perform the controls at a higher speed based on the signal output from the signal synchronizer 20. Therefore, it is possible to rapidly perform the processing for adjusting the input impedance of the matching circuit 15.

[Configuration of Signal Synchronizer 20]

Figure 2:
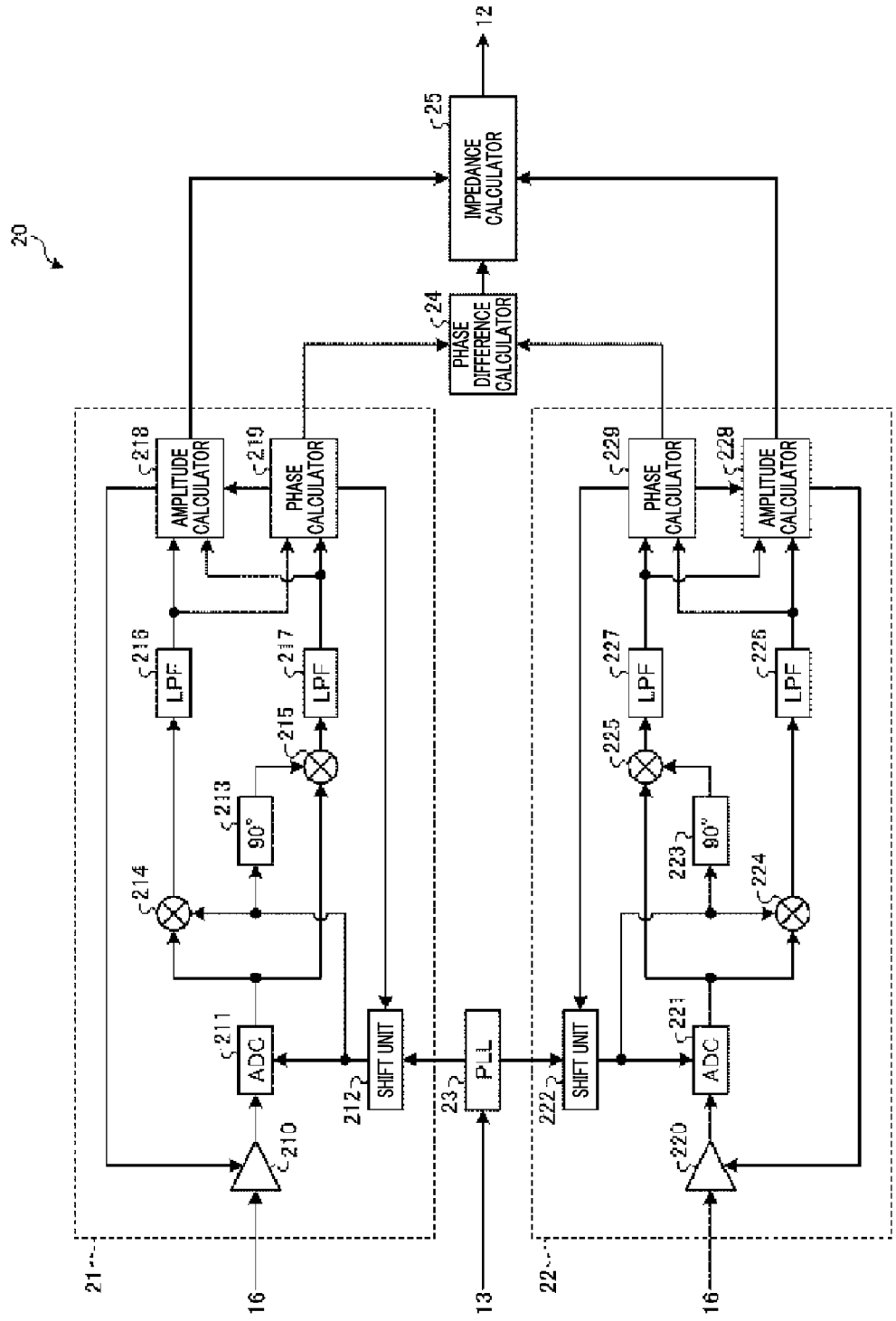
FIG. 2 is a block diagram showing an example of a signal synchronizer.

FIG. 2 is a block diagram showing an example of the signal synchronizer 20. The signal synchronizer 20 is equipped with an amplitude/phase calculator 21, an amplitude/phase calculator 22, a phase locked loop (PLL) 23, a phase difference calculator 24, and an impedance calculator 25.

The PLL 23 is configured to generate a clock signal of a frequency according to the control signal output from the control signal generator 13. The control signal output from the control signal generator 13 is a digital value for setting the frequency. Then, the PLL 23 outputs the generated clock signal to each of the amplitude/phase calculator 21 and the amplitude/phase calculator 22. The PLL 23 is an example of a signal generator.

The amplitude/phase calculator 21 is configured to calculate an amplitude and a phase of the voltage output from the power sensor 16 and configured to output a value of the calculated phase of the voltage to the phase difference calculator 24 and a value of the calculated amplitude of the voltage to the impedance calculator 25. The amplitude/phase calculator 21 is equipped with an amplifier 210, an ADC 211, a shift unit 212, a phase shifter 213, a multiplier 214, a multiplier 215, a low pass filter (LPF) 216, a LPF 217, an amplitude calculator 218, and a phase calculator 219.

The amplifier 210 is configured to amplify the amplitude of the voltage output from the power sensor 16 with a gain received from the amplitude calculator 218. The ADC 211 is configured to convert a waveform of the voltage of the analog signal amplified by the amplifier 210 into a digital signal at the timing of the clock signal output from the shift unit 212. The shift unit 212 is configured to shift a phase of the clock signal output from the PLL 23 according to a control value output from the phase calculator 219. The amplifier 210 is an example of a first amplifier, the ADC 211 is an example of a first ADC, and the shift unit 212 is an example of a first phase adjusting unit.

The multiplier 214 is configured to multiply the signal output from the ADC 211 by the clock signal of a frequency equal to half the frequency of the clock signal output from the shift unit 212, and configured to output a multiplication result to the LPF 216. The multiplication result output from the multiplier 214 is an I (In phase) component of the signal of the voltage output from the power sensor 16. The LPF 216 is configured to remove a high frequency component of the multiplication result output from the multiplier 214 and configured to output a signal from which the high frequency component has been removed to each of the amplitude calculator 218 and the phase calculator 219.

The phase shifter 213 is configured to shift the phase of the clock signal output from the shift unit 212 by 90 degrees. The multiplier 215 is configured to multiply the signal output from the ADC 211 by the clock signal of the frequency equal to half the frequency of the clock signal output from the phase shifter 213 and configured to output a multiplication result to the LPF 217. The multiplication result output from the multiplier 215 is a Q (Quadrature phase) component of the signal of the voltage output from the power sensor 16. The LPF 217 is configured to remove a high frequency component of the multiplication result output from the multiplier 215 and configured to output a signal from which the high frequency component has been removed to each of the amplitude calculator 218 and the phase calculator 219.

The phase calculator 219 is configured to calculate a phase of the voltage based on the magnitude of the signal of the I component of the voltage output from the LPF 216 and the magnitude of the signal with the Q component of the voltage output from the LPF 217. The phase calculator 219 calculates the phase of the voltage based on, for example, a coordinate rotation digital computer (CORDIC) algorithm. Then, the phase calculator 219 maintains the calculated phase.

Then, the phase calculator 219 calculates a control value of a phase to make the calculated phase equal to a predetermined value (e.g., 0 degree) with respect to the phase of the clock signal output from the PLL 23. Then, the phase calculator 219 outputs the calculated control value to the shift unit 212. Thus, the phase of the clock signal output to the phase shifter 213 and the multiplier 214 is shifted by the shift unit 212 and the phase of the voltage specified by the signals output from the LPF 216 and the LPF 217 has the predetermined value. When the phase of the voltage has the predetermined value, the phase calculator 219 outputs a value of the maintained phase of the voltage to the phase difference calculator 24 and directs the amplitude calculator 218 to output the amplitude of the voltage. Herein, the expression that the phase of the voltage has the predetermined value means that the phase of the clock signal shifted by the shift unit 212 is synchronized with the phase of the voltage. Since the phase of the clock signal shifted by the shift unit 212 is synchronized with the phase of the voltage, the amplitude of the voltage can be calculated with high accuracy. Hereinafter, the synchronization between the phase of the clock signal shifted by the shift unit 212 and the phase of the voltage will be described as synchronization between a calculation result of an amplitude of the voltage and a calculation result of a phase.

The amplitude calculator 218 is configured to monitor the amplitude of each signal output from the LPF 216 and the LPF 217 and configured to adjust the gain provided to the amplifier 210 such that the signal of the higher amplitude has an amplitude within a predetermined range. Further, if the amplitude calculator 218 is directed to output the amplitude by the phase calculator 219, the amplitude calculator 218 outputs, as the value of the amplitude of the voltage, the value of the amplitude of the signal of the higher amplitude between signals output from the LPF 216 and the LPF 217 to the impedance calculator 25. The amplitude calculator 218 and the phase calculator 219 are examples of a second calculator.

The amplitude/phase calculator 22 is configured to calculate the amplitude and the phase of the current output from the power sensor 16 and configured to output the calculated phase of the current to the phase difference calculator 24 and the calculated amplitude of the current to the impedance calculator 25. The amplitude/phase calculator 22 is equipped with an amplifier 220, an ADC 221, a shift unit 222, a phase shifter 223, a multiplier 224, a multiplier 225, a LPF 226, a LPF 227, an amplitude calculator 228, and a phase calculator 229.

The amplifier 220 is configured to amplify the amplitude of the current output from the power sensor 16 with a gain received from the amplitude calculator 228. The ADC 221 is configured to convert a waveform of the current of the analog signal amplified by the amplifier 220 into a digital signal at the timing of the clock signal output from the shift unit 222. The shift unit 222 is configured to shift a phase of the clock signal output from the PLL 23 according to a control value output from the phase calculator 229. The amplifier 220 is an example of a second amplifier, the ADC 221 is an example of a second ADC, and the shift unit 222 is an example of a second phase adjusting unit.

The multiplier 224 is configured to multiply the signal output from the ADC 221 by the clock signal of a frequency equal to half the frequency of the clock signal output from the shift unit 222, and configured to output a multiplication result to the LPF 226. The multiplication result output from the multiplier 224 is the I component of the signal of the current output from the power sensor 16. The LPF 226 is configured to remove a high frequency component of the multiplication result output from the multiplier 224 and configured to output a signal from which the high frequency component has been removed to each of the amplitude calculator 228 and the phase calculator 229.

The phase shifter 223 is configured to shift the phase of the clock signal output from the shift unit 222 by 90 degrees. The multiplier 225 is configured to multiply the signal output from the ADC 221 by the clock signal of the frequency equal to half the frequency of the clock signal output from the phase shifter 223 and configured to output a multiplication result to the LPF 227. The multiplication result output from the multiplier 225 is the Q component of the signal of the current output from the power sensor 16. The LPF 227 is configured to remove a high frequency component of the multiplication result output from the multiplier 225 and configured to output a signal from which the high frequency component has been removed to each of the amplitude calculator 228 and the phase calculator 229.

The phase calculator 229 is configured to calculate a phase of the current based on the magnitude of the signal of the I component of the current output from the LPF 226 and the magnitude of the signal of the Q component of the current output from the LPF 227. The phase calculator 229 calculates the phase of the current based on, for example, a CORDIC algorithm. Then, the phase calculator 229 maintains the calculated phase.

Then, the phase calculator 229 calculates a control value of a phase to make the calculated phase equal to a predetermined value (e.g., 0 degree) with respect to the phase of the clock signal output from the PLL 23. Then, the phase calculator 229 outputs the calculated control value to the shift unit 222. Thus, the phase of the clock signal output to the phase shifter 223 and the multiplier 224 is shifted by the shift unit 222 and the phase of the current specified by the signals output from the LPF 226 and the LPF 227 has a predetermined value. When the phase of the current has the predetermined value, the phase calculator 229 outputs a value of the maintained phase of the current to the phase difference calculator 24 and directs the amplitude calculator 228 to output the amplitude of the current. Herein, the expression that the phase of the current has a predetermined value means that the phase of the clock signal shifted by the shift unit 222 is synchronized with the phase of the current. Since the phase of the clock signal shifted by the shift unit 222 is synchronized with the phase of the current, the amplitude of the current can be calculated with high accuracy. Hereinafter, the synchronization between the phase of the clock signal shifted by the shift unit 222 and the phase of the current will be described as synchronization between a calculation result of an amplitude of the current and a calculation result of a phase.

The amplitude calculator 228 is configured to monitor the amplitude of each signal output from the LPF 226 and the LPF 227 and configured to adjust the gain provided to the amplifier 220 such that the signal of the higher amplitude has an amplitude within a predetermined range. Further, if the amplitude calculator 228 is directed to output the amplitude by the phase calculator 229, the amplitude calculator 228 outputs, as the value of the amplitude of the current, the value of the amplitude of the signal of the higher amplitude between the signals output from the LPF 226 and the LPF 227 to the impedance calculator 25. The amplitude calculator 228 and the phase calculator 229 are examples of a second calculator.

The phase difference calculator 24 is configured to calculate a phase difference between the voltage and the current based on the phase of the voltage output from the amplitude/phase calculator 21 and the phase of the current output from the amplitude/phase calculator 22. Then, the phase difference calculator 24 outputs the calculated phase difference to the impedance calculator 25.

The impedance calculator 25 is configured to calculate an amplitude ratio between the voltage and the current based on the amplitude of the voltage output from the amplitude/phase calculator 21 and the amplitude of the current output from the amplitude/phase calculator 22. Then, the impedance calculator 25 calculates an impedance based on the calculated amplitude ratio and the phase difference output from the phase difference calculator 24. Then, the impedance calculator 25 outputs the calculated impedance to the control amount calculator 12.

Herein, in the amplitude/phase calculator 21 of the present exemplary embodiment, the phase calculator 219 feedbacks the control value to the shift unit 212 such that the calculated phase of the voltage has the predetermined value (e.g., 0 degree). Thus, the phases of voltages output from the LPF 216 and the LPF 217 can be adjusted to the predetermined value. Therefore, the degree of accuracy in the amplitude of the voltage detected by the amplitude calculator 218 can be improved. Likewise, in the amplitude/phase calculator 22, the degree of accuracy in the amplitude of the current detected by the amplitude calculator 228 can be improved. Accordingly, the degree of accuracy in the impedance calculated by the signal synchronizer 20 can be improved.

Further, the amplitude calculator 218 monitors the amplitude of each signal output from the LPF 216 and the LPF 217 and adjusts the gain provided to the amplifier 210 such that the signal of the higher amplitude has the amplitude within the predetermined range. Accordingly, even when the voltage is measured by the power sensor 16 at an impedance different from the predetermined impedance of 50Ω or the like, the range of voltage can be automatically adjusted, so that the amplitude of the voltage can be calculated with higher accuracy. Likewise, the amplitude calculator 228 adjusts the gain provided to the amplifier 220 such that the signal of the higher amplitude has the amplitude within the predetermined range. Accordingly, even when the current is measured by the power sensor 16 at an impedance different from the predetermined impedance of 50Ω or the like, the range of current can be automatically adjusted, so that the amplitude of the current can be calculated with higher accuracy.

Furthermore, since the clock signal generated by the single PLL 23 is commonly used by the units within the signal synchronizer 20, the difference in timing of blocks within the signal synchronizer 20 can be reduced. Therefore, the amplitudes and the phases of the voltage and the current can be calculated with high accuracy. Accordingly, the degree of accuracy in calculating the impedance can be improved.

Moreover, since the PLL 23 generates the clock signal based on the control value output from the control signal generator 13, the clock signal of the frequency having a small difference from the frequency of the high frequency power output from the high frequency power source 14 can be generated. For this reason, the amplitudes and the phases of the voltage and the current can be calculated with high accuracy. Accordingly, the degree of accuracy in calculating the impedance can be improved.

Figure 3:
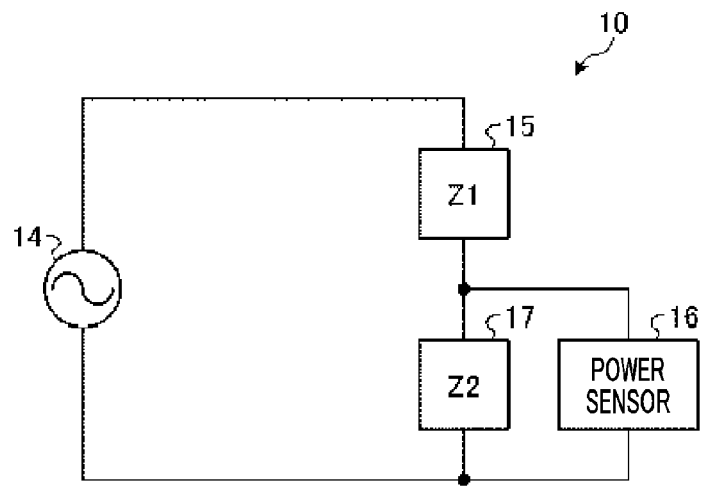
FIG. 3 is a diagram showing an example of an equivalent circuit of the plasma processing apparatus according to the exemplary embodiment 1.

FIG. 3 is a diagram showing an example of an equivalent circuit of the plasma processing apparatus 10 according to the exemplary embodiment 1. In the present exemplary embodiment, the power sensor 16 is connected to the node between the matching circuit 15 and the chamber 17 on the transmission path for the high frequency power output from the high frequency power source 14 and supplied into the chamber 17 through the matching circuit 15. For this reason, the signal synchronizer 20 can measure the impedance of the chamber 17 containing the plasma based on the measurement value obtained by the power sensor 16.

Figure 4:
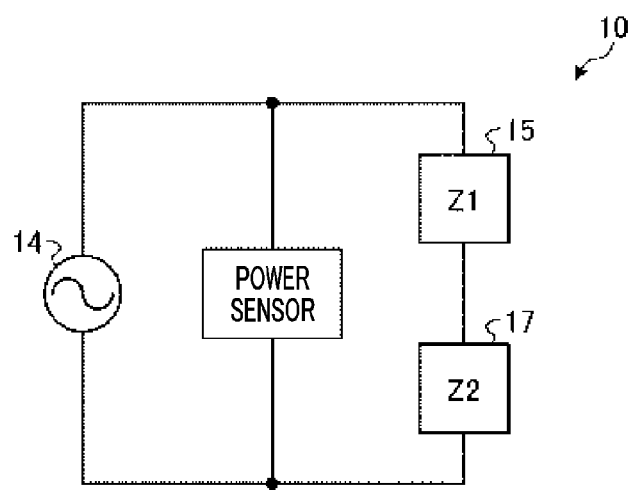
FIG. 4 is a diagram showing an example of an equivalent circuit of a plasma processing apparatus according to a comparative example 1.

Herein, for example, as shown in FIG. 4, if the power sensor is connected to a node between the high frequency power source 14 and the matching circuit 15, an impedance measured from a measurement value obtained by the power sensor becomes a combined impedance of an impedance of the matching circuit 15 and an impedance of the chamber 17 containing plasma. FIG. 4 is a diagram showing an example of an equivalent circuit of the plasma processing apparatus 10 according to a comparative example 1.

For this reason, in the example shown in FIG. 4, the impedance of the matching circuit 15 and the impedance of the chamber 17 containing the plasma are separately estimated based on the measured impedance. Since it is difficult to accurately estimate each impedance, an estimation result contains a certain amount of error. In the plasma processing apparatus 10 according to the comparative example 1 shown in FIG. 4, there are two causes of the error, i.e., the impedance of the matching circuit 15 and the impedance of the chamber 17 containing the plasma.

In this regard, in the plasma processing apparatus 10 according to the present exemplary embodiment, as shown in FIG. 3, the impedance of the chamber 17 containing the plasma is calculated based on the measurement value obtained by the power sensor 16. Further, the current input impedance of the matching circuit 15 is estimated based on the circuit model of the matching circuit 15. Although it is difficult to accurately estimate the current input impedance of the matching circuit 15, there is only one cause of the error, i.e., the impedance of the matching circuit 15. For this reason, it is possible to reduce the causes of the error as compared to the plasma processing apparatus 10 according to the comparative example 1 shown in FIG. 4.

Further, since the matching circuit 15 has a simpler structure than the chamber 17, an error is smaller when estimating the impedance of the matching circuit 15 than when estimating the impedance of the chamber 17 containing the plasma. Therefore, the plasma processing apparatus 10 according to the present exemplary embodiment can calculate the impedance of the matching circuit 15 and the impedance of the chamber 17 containing the plasma with higher accuracy than the plasma processing apparatus 10 according to the comparative example 1.

[Matching Processing]

Figure 5:
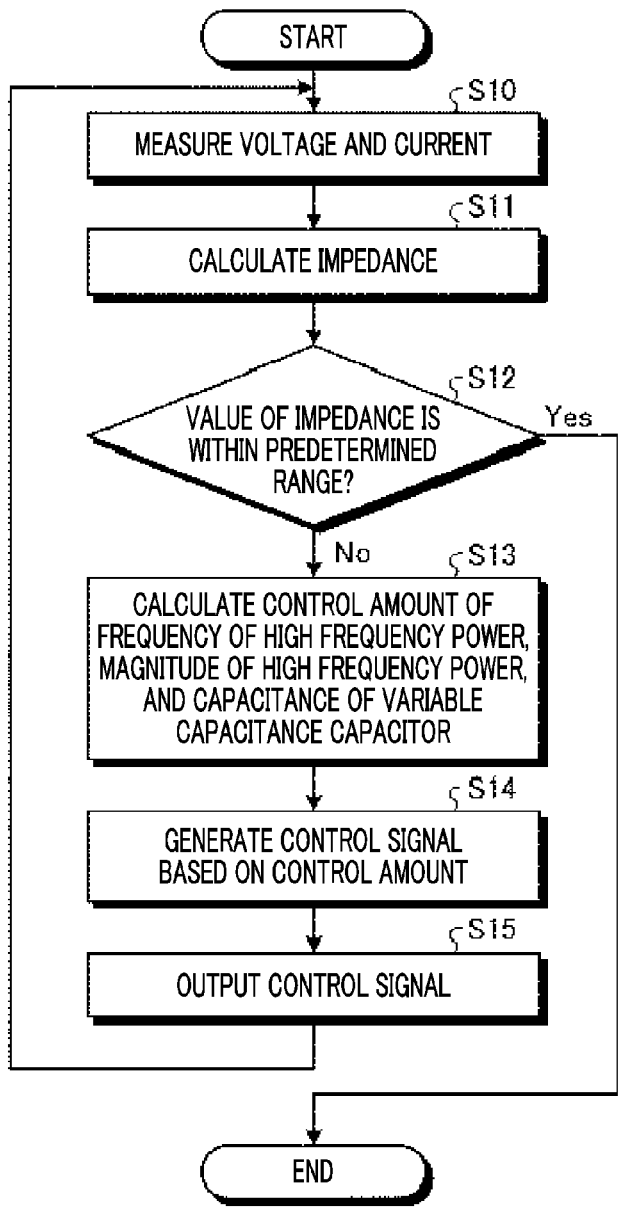
FIG. 5 is a flowchart showing an example of impedance matching processing.

FIG. 5 is a flowchart showing an example of the impedance matching processing. The plasma processing apparatus 10 performs the matching processing as shown in the present flowchart when the plasma is generated within the chamber 17.

First, the power sensor 16 measures the voltage and the current of the high frequency power supplied into the chamber 17 through the matching circuit 15 (S10). Then, the power sensor 16 outputs the measurement result of the voltage and the current to the signal synchronizer 20.

Then, the signal synchronizer 20 calculates the impedance of the chamber 17 including the impedance of the plasma generated within the chamber 17 based on the measurement result of the voltage and the current of the high frequency power output from the power sensor 16 and the control signal output from the control signal generator 13 (S11). Then, the signal synchronizer 20 outputs the calculated impedance of the chamber 17 to the control amount calculator 12.

Then, the control amount calculator 12 calculates the current input impedance of the matching circuit 15 based on the impedance of the chamber 17 calculated by the signal synchronizer 20. Then, the control amount calculator 12 determines whether a value of the current input impedance of the matching circuit 15 is within a predetermined range from a target value (S12). If the value of the current input impedance of the matching circuit 15 is within the predetermined range from the target value (S12: Yes), the matching processing shown in the present flowchart is ended.

Meanwhile, if the value of the current input impedance of the matching circuit 15 is not within the predetermined range from the target value (S12: No), the control amount calculator 12 calculates the frequency of the high frequency power, the magnitude of the high frequency power, and the capacitances of the respective variable capacitance capacitors within the matching circuit 15 to allow the input impedance of the matching circuit 15 to reach the target input impedance (S13). Then, the control amount calculator 12 outputs these calculated control amounts to the control signal generator 13.

Then, the control signal generator 13 generates the control signals for the respective control amounts of the frequency of the high frequency power, the magnitude of the high frequency power, and the capacitances of the respective variable capacitance capacitors within the matching circuit 15 output from the control amount calculator 12 (S14). Then, the control signal generator 13 outputs the generated control signals to the oscillator 140, the amplifier 141, and the matching circuit 15, respectively (S15). Then, the processing S10 is performed again.

Herein, in the case where the control amounts of the frequency of the high frequency power, the magnitude of the high frequency power, and the capacitances of the respective variable capacitance capacitors within the matching circuit 15 are calculated independently of each other regardless of the control amounts of the other parameters, when the control amounts of these parameters are simultaneously applied, the controlled oscillation is likely to be generated. For this reason, if the control amounts of some parameters are applied, the controls of the other parameters are fixed.

Figure 6:
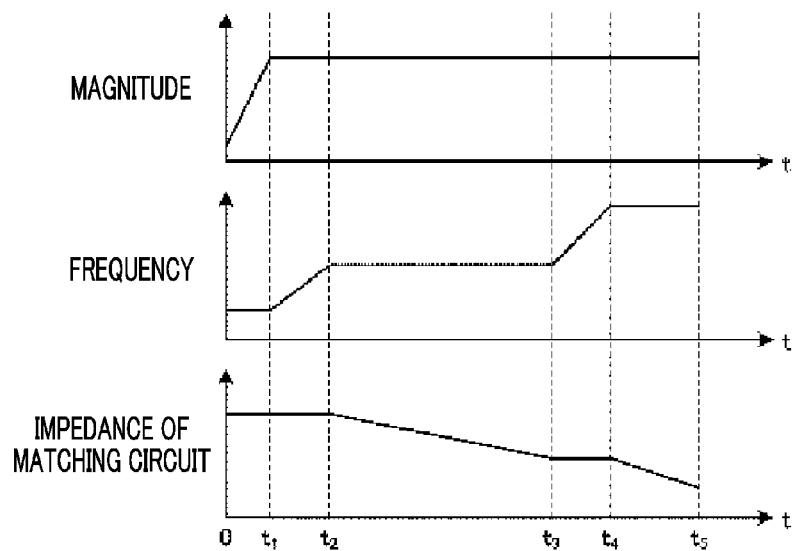
FIG. 6 is a diagram showing an example of matching processing according to a comparative example 2.
Figure 7:
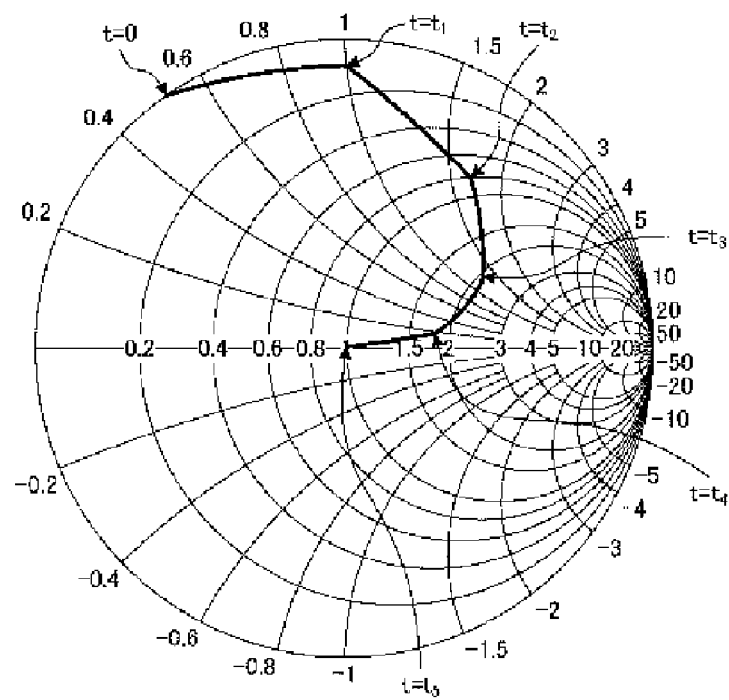
FIG. 7 is a diagram showing an example of a change in input impedance of a matching circuit according to the comparative example 2.

Specifically, for example, as shown in FIG. 6, during a period from a time 0 to a time $t_1$, the control amount of the magnitude of the high frequency power is applied and the frequency of the high frequency power and the impedance of the matching circuit 15 are fixed. Further, during a period from the time $t_1$ to a time $t_2$ and a period from the time $t_3$ to the time $t_4$, the control amount of the frequency of the high frequency power is applied and the magnitude of the high frequency power and the impedance of the matching circuit 15 are fixed. Furthermore, during a period from the time $t_2$ to the time $t_3$ and a period from the time $t_4$ to a time $t_5$, the control amount of the impedance of the matching circuit 15 is applied and the frequency and the magnitude of the high frequency power are fixed. FIG. 6 is a diagram showing an example of a matching processing according to the comparative example 2. In this case, a trajectory for an input impedance of the matching circuit 15 on the Smith chart is, for example, as shown in FIG. 7. FIG. 7 is a diagram showing an example of a change in the input impedance of the matching circuit 15 according to the comparative example 2.

As described above, if the control amounts of the respective parameters are calculated independently of each other regardless of the control amounts of the other parameters, it is difficult to simultaneously apply the control amounts of the respective parameters, so that a long time is required to perform the impedance matching. Further, as the number of parameters is increased, a longer time is required to perform the impedance matching.

Figure 8:
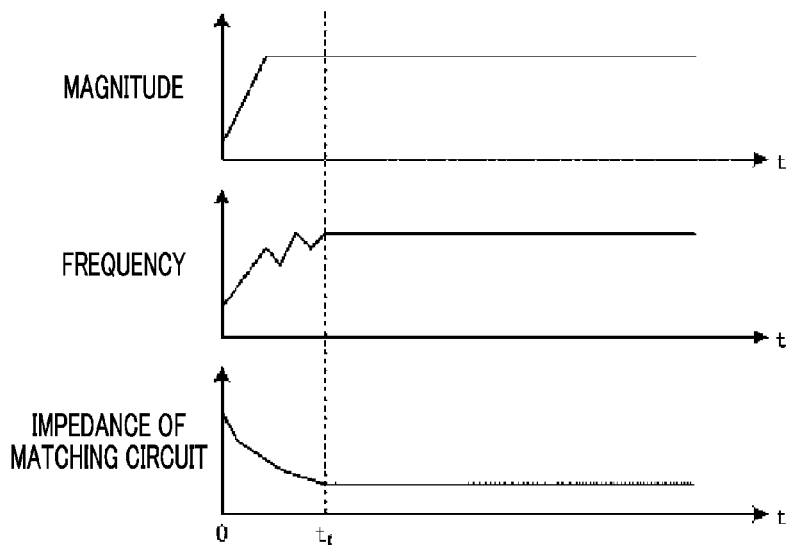
FIG. 8 is a diagram showing an example of matching processing according to the exemplary embodiment 1.
Figure 9:
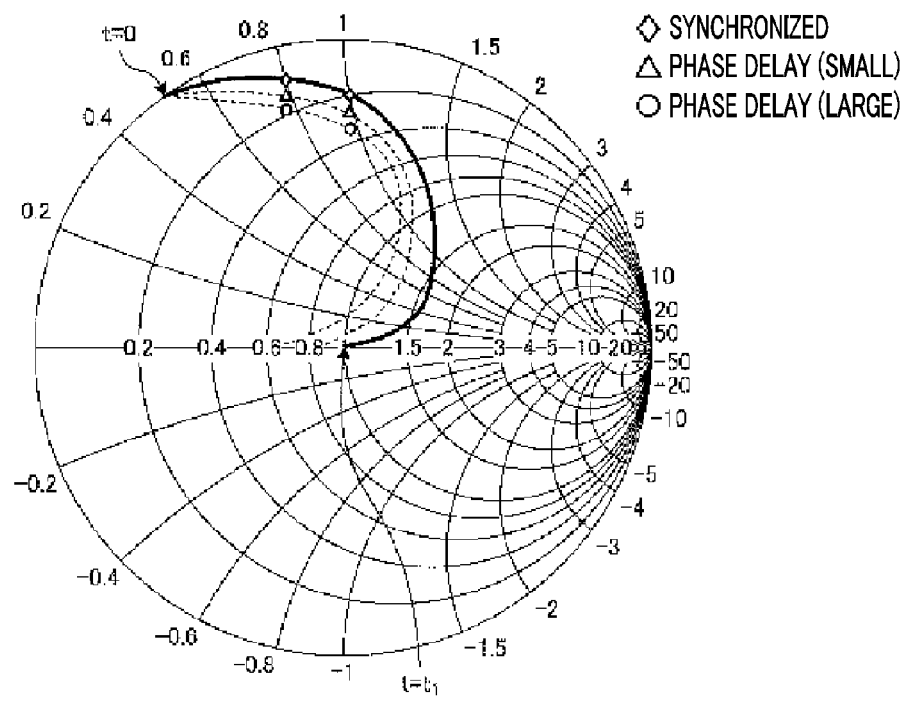
FIG. 9 is a diagram showing an example of a change in input impedance of a matching circuit.

In this regard, in the plasma processing apparatus 10 according to the present exemplary embodiment, the control amounts of the respective parameters such as the frequency of the high frequency power, the magnitude of the high frequency power, and the capacitances of the respective variable capacitance capacitors within the matching circuit 15 are determined in consideration of the balance with the other parameters based on the model equation (1). For this reason, even if the control amounts of the respective parameters are simultaneously applied, the controlled oscillation is less likely to be generated. As a result, for example, as shown in FIG. 8, the control amounts of multiple parameters can be simultaneously applied, and, thus, it is possible to greatly reduce the time required to perform the impedance matching processing as compared to the plasma processing apparatus 10 according to the comparative example 2. FIG. 8 is a diagram showing an example of the matching processing according to the exemplary embodiment 1. In this case, the trajectory for the input impedance of the matching circuit 15 on the Smith chart is, for example, as indicated by a solid line in FIG. 9. FIG. 9 is a diagram showing an example of a change in the input impedance of the matching circuit 15.

Herein, when the phase of the clock signal output from the shift unit 212 is delayed with respect to the phase of the voltage measured by the power sensor 16, the amplitude calculation result is not synchronized with the phase calculation result. For this reason, for example, as indicated by dotted lines in FIG. 9, the input impedance of the matching circuit 15 varies along trajectories deviating from a desired trajectory (e.g., the trajectory indicated by the solid line with squares in FIG. 9). If the phase delay is small (e.g., about 1 μsec for the high frequency power of several MHz to several tens MHz), the input impedance of the matching circuit 15 varies along, e.g., the trajectory indicated by the dotted line with triangles in FIG. 9. Further, if the phase delay is relatively large (e.g., about 10 μsec for the high frequency power of several MHz to several tens MHz), the input impedance of the matching circuit 15 varies along, e.g., the trajectory indicated by the dotted line with circles in FIG. 9. As the delay of the phase of the clock signal output from the shift unit 212 with respect to the phase of the voltage measured by the power sensor 16 is increased, the impedance error calculated by the signal synchronizer 20 is increased. Thus, a deviation between the trajectory along which the input impedance of the matching circuit 15 varies and the desired trajectory is increased, which makes it difficult to stably control the plasma.

In this regard, in the amplitude/phase calculator 21 according to the present exemplary embodiment, the phase calculator 219 feedbacks the calculated phase to the shift unit 212. Thus, the amplitude/phase calculator 21 can adjust the delay of the phase of the clock signal output from the shift unit 212 with respect to the phase of the voltage measured by the power sensor 16. Therefore, it is possible to synchronize the amplitude calculation result with the phase calculation result. The same is applied for the amplitude/phase calculator 22. Thus, the signal synchronizer 20 can calculate the amplitudes and the phases of the voltage and the current measured by the power sensor 16 with high accuracy. Further, the plasma processing apparatus 10 can control the input impedance of the matching circuit 15 to vary along the desired trajectory with high accuracy according to the change in the impedance of the plasma within the chamber 17. Accordingly, it is possible to stably control the plasma.

Further, in the present exemplary embodiment, since the control amounts of the respective parameters can be simultaneously applied, it is possible to reduce the time required to perform the impedance matching processing. Furthermore, since the control amounts of the respective parameters can be simultaneously applied, even if the number of parameters is increased, the time required to perform the impedance matching processing is little changed.

The exemplary embodiment 1 has been described above. As can be clearly seen from the above description, the plasma processing apparatus 10 according to the present exemplary embodiment can complete impedance the matching processing in a short time and thus rapidly ignite the stable plasma.

Exemplary Embodiment 2

In the exemplary embodiment 1, the current impedance of the matching circuit 15 is estimated based on the voltage and the current of the high frequency power measured by the power sensor 16 connected to the node between the matching circuit 15 and the chamber 17. In this regard, in the exemplary embodiment 2, a current impedance of the matching circuit 15 is estimated by further using a power sensor 18 connected to the node between the high frequency power source 14 and the matching circuit 15. Thus, the current impedance of the matching circuit 15 can be estimated with higher accuracy. Therefore, it is possible to rapidly perform the impedance matching processing.

[Plasma Processing Apparatus 10]

Figure 10:
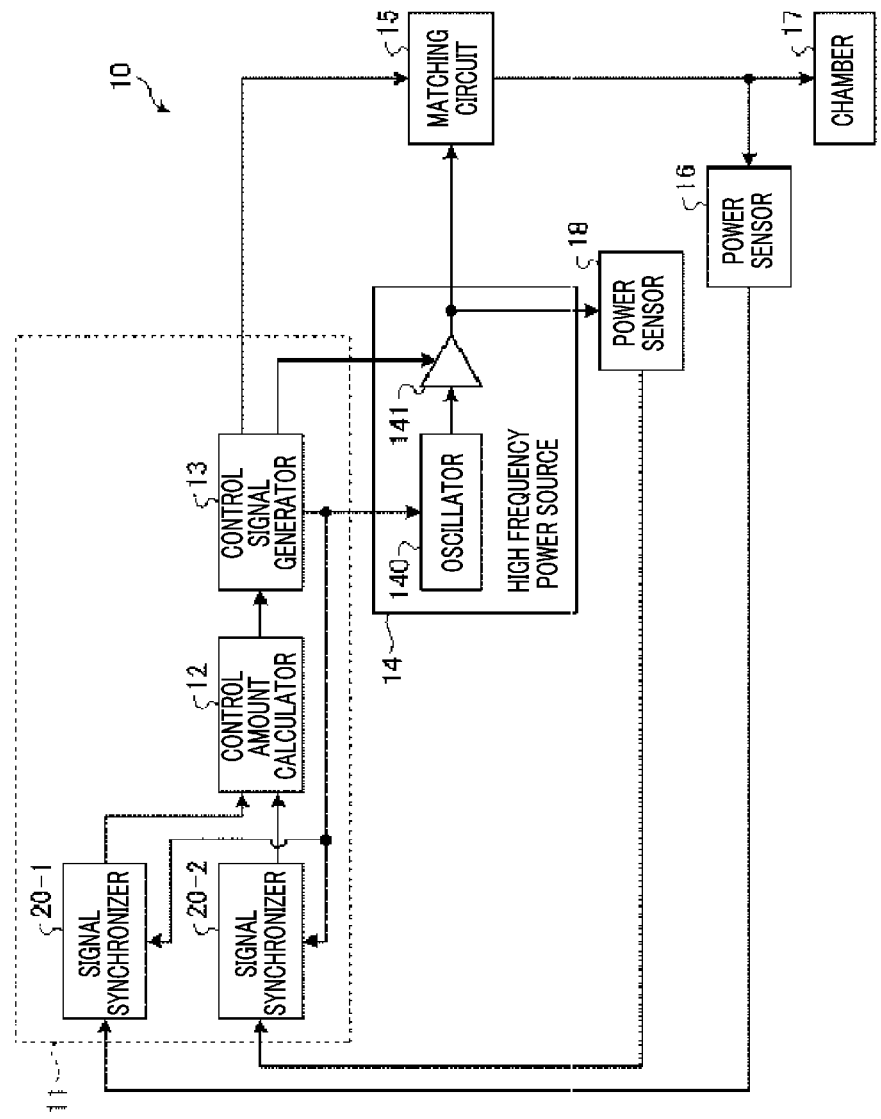
FIG. 10 is a block diagram showing an example of a plasma processing apparatus according to an exemplary embodiment 2.

FIG. 10 is a block diagram showing an example of the plasma processing apparatus 10 according to the exemplary embodiment 2. For example, as shown in FIG. 10, the plasma processing apparatus 10 is equipped with a signal synchronizer 20-1, a signal synchronizer 20-2, the control amount calculator 12, the control signal generator 13, the high frequency power source 14, the matching circuit 15, the power sensor 16, the chamber 17, and the power sensor 18. In the present exemplary embodiment, the signal synchronizer 20-1, the signal synchronizer 20-2, the control amount calculator 12, and the control signal generator 13 are actually provided on the single substrate 11. Further, hereinafter, when collectively referred to, the signal synchronizers 20-1 and 20-2 will be simply described as the signal synchronizer 20 without being distinguished from each other. Further, some of blocks of the plasma processing apparatus 10 shown in FIG. 10 are assigned identical reference numerals to some blocks shown in FIG. 1 and perform the same functions as the blocks shown in FIG. 1 except the following features. Therefore, redundant description will be omitted.

The power sensor 16 outputs the measurement result of the voltage and the current to the signal synchronizer 20-1. The power sensor 18 is connected to the node between the high frequency power source 14 and the matching circuit 15 on the transmission path for the high frequency power between the high frequency power source 14 and the matching circuit 15. The power sensor 18 is configured to measure the voltage and the current of the high frequency power output from the high frequency power source 14 and configured to output the measurement result of the voltage and the current to the signal synchronizer 20-2. The power sensor 18 is an example of a second measurement unit.

The signal synchronizer 20-1 is configured to calculate the impedance of the chamber 17 including the impedance of the plasma generated within the chamber 17 based on the measurement result of the voltage and the current of the high frequency power output from the power sensor 16 and the control signal output from the control signal generator 13. Then, the signal synchronizer 20-1 outputs the calculated impedance of the chamber 17 to the control amount calculator 12.

The signal synchronizer 20-2 is configured to calculate the combined impedance of the matching circuit 15 and the chamber 17 based on the measurement result of the voltage and the current of the high frequency power output from the power sensor 18 and the control signal output from the control signal generator 13. Then, the signal synchronizer 20-2 outputs the calculated combined impedance to the control amount calculator 12. Each of the signal synchronizers 20-1 and 20-2 has the same internal configuration as the signal synchronizer 20 of the exemplary embodiment 1 described above with reference to FIG. 2. Therefore, a detailed description thereof will be omitted.

The control amount calculator 12 calculates the current input impedance of the matching circuit 15 based on the impedance of the chamber 17 calculated by the signal synchronizer 20-1 and the combined impedance calculated by the signal synchronizer 20-2.

Figure 11:
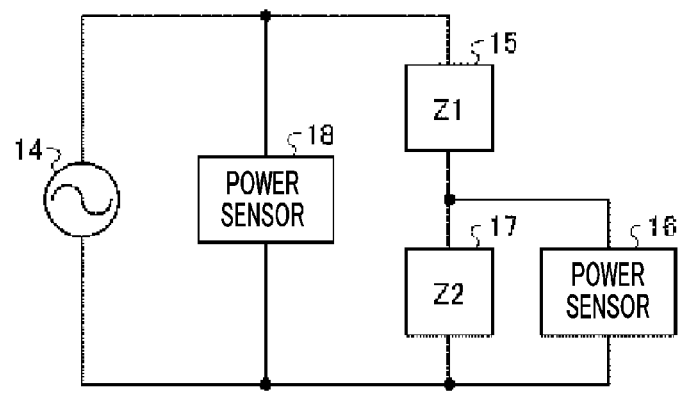
FIG. 11 is a diagram showing an example of an equivalent circuit of the plasma processing apparatus according to the exemplary embodiment 2.

FIG. 11 is a diagram showing an example of an equivalent circuit of the plasma processing apparatus 10 according to the exemplary embodiment 2. For example, as shown in FIG. 11, the signal synchronizer 20-1 can calculate an impedance Z2 of the chamber 17 based on the voltage and the current measured by the power sensor 16. The signal synchronizer 20-2 can calculate a combined impedance of an impedance Z1 of the matching circuit 15 and the impedance Z2 of the chamber 17 based on the voltage and the current measured by the power sensor 18. Further, the control amount calculator 12 can calculate the impedance Z1 of the matching circuit 15 by subtracting the impedance Z2 of the chamber 17 from the combined impedance of the impedance Z1 of the matching circuit 15 and the impedance Z2 of the chamber 17.

Herein, the signal synchronizer 20-1 calculates the impedance Z2 of the chamber 17 based on the voltage and the current measured by the power sensor 16 and the signal synchronizer 20-2 calculates the combined impedance of the matching circuit 15 and the chamber 17 based on the voltage and the current measured by the power sensor 18. For this reason, it is possible to calculate the impedance Z2 and the combined impedance with higher accuracy as compared to the case where the impedance is estimated by using a circuit model or the like. Particularly in the present exemplary embodiment, the signal synchronizers 20-1 and 20-2 having the internal configuration described above with reference to FIG. 2 are provided. Therefore, it is possible to calculate the impedance Z2 and the combined impedance with high accuracy.

Further, in the present exemplary embodiment, since the impedance Z2 and the combined impedance are calculated with high accuracy, the impedance Z1 of the matching circuit 15 can be calculated with high accuracy by subtracting the impedance Z2 of the chamber 17 from the combined impedance.

[Hardware]

Figure 12:
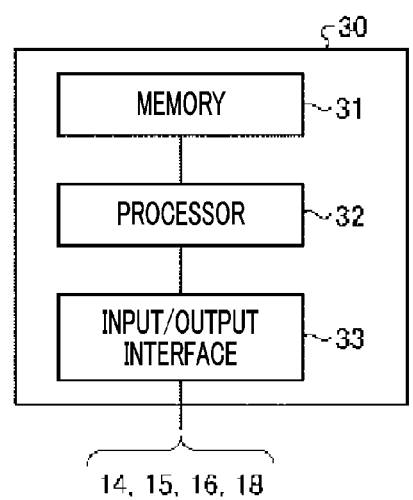
FIG. 12 is a diagram showing an example of hardware of a computer that implements functions of a signal synchronizer, a control amount calculator, and a control signal generator.

The signal synchronizer 20, the control amount calculator 12, and the control signal generator 13 according to the exemplary embodiment 1 are implemented by a computer 30, for example, as illustrated in FIG. 12, provided on the single substrate 11. FIG. 12 is a diagram showing an example of the hardware of the computer 30 that implements functions of the signal synchronizer 20, the control amount calculator 12, and the control signal generator 13.

The computer 30 is equipped with, for example, a memory 31, a processor 32, and an input/output interface 33, as illustrated in FIG. 12. The input/output interface 33 is configure to transmit and receive the signals to and from the high frequency power source 14, the matching circuit 15, the power sensor 16, and the power sensor 18. The memory 31 is configured to store therein, for example, various programs or data for implementing the functions of the signal synchronizer 20, the control amount calculator 12, and the control signal generator 13. The processor 32 reads a program from the memory 31 and executes the program to implement the functions of, for example, the signal synchronizer 20, the control amount calculator 12, and the control signal generator 13.

Further, all of the programs or data in the memory 31 are not necessarily stored in the memory 31 from the beginning. The programs or data may be stored in a movable recording medium such as a memory card that can be inserted into the computer 30 and the computer 30 may appropriately obtain programs or data from the movable recording medium and execute the program or data. Further, the computer 30 may appropriately obtain programs from another computer or server that stores therein the programs or data, through a wireless communication line, a public line, the Internet, LAN, WAN, and the like and execute the program.

[Others]

The present disclosure is not limited to the above-described exemplary embodiments and various changes and modifications can be made within the scope of the present disclosure.

For example, in the exemplary embodiment 1, it has been described that high frequency power generated by the single high frequency power source 14 is supplied into the chamber 17, but the present disclosure is not limited thereto, and high frequency powers of different frequencies generated by multiple high frequency power sources 14 may be supplied into the chamber 17. In this case, each high frequency power source 14 configured to generate the high frequency power of its frequency is equipped with the signal synchronizer 20, the control amount calculator 12, the control signal generator 13, the matching circuit 15, and the power sensor 16 in the plasma processing apparatus 10.

Likewise, in the exemplary embodiment 2, if the high frequency powers of different frequencies generated by the multiple high frequency power sources 14 are supplied into the chamber 17, each high frequency power source 14 configured to generate the high frequency power of its frequency is equipped with the signal synchronizer 20-1, the signal synchronizer 20-2, the control amount calculator 12, the control signal generator 13, the matching circuit 15, the power sensor 16, and the power sensor 18 in the plasma processing apparatus 10.

Further, in each of the above-described exemplary embodiments, to facilitate understanding of the signal synchronizer 20, the processing blocks of the signal synchronizer 20 are distinguished by the function according to the main processings. For this reason, the technology disclosed herein is not limited by the distinguishing method or the names of the processing blocks. Furthermore, the processing blocks of the signal synchronizer 20 in each of the above-described exemplary embodiments may be further divided into more processing blocks or multiple processing blocks may be combined into a single processing block depending on their processings. Moreover, the processings performed by the respective processing blocks may be implemented by software or dedicated hardware such as an application-specific integrated circuit (ASIC) or the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A plasma processing apparatus, comprising:
   a chamber in which an internal space is provided and a processing target object carried into the internal space is processed with a plasma generated in the internal space;
   a power supply unit configured to supply a first high frequency power for plasma generation within the chamber;
   a matching circuit configured to match an impedance of the plasma within the chamber with an impedance of the power supply unit;
   a first calculator configured to calculate the impedance of the plasma within the chamber;
   a control circuit configured to control a frequency of the first high frequency power supplied into the chamber, a magnitude of the first high frequency power, and an impedance of the matching circuit based on the impedance calculated by the first calculator; and
   a first measurement unit connected to a node between the matching circuit and the chamber and configured to measure a voltage and a current of the first high frequency power supplied into the chamber,
   wherein the first calculator and the control circuit are provided on a single substrate, and
   the first calculator calculates the impedance of the plasma within the chamber based on the voltage and the current of the first high frequency power measured by the first measurement unit.

2. The plasma processing apparatus of claim 1, wherein the first calculator includes:
   a first analog to digital converter (ADC) configured to convert a voltage of the first high frequency power supplied into the chamber into a digital signal;

a second ADC configured to convert a current of the first high frequency power supplied into the chamber into a digital signal;

a second calculator configured to calculate a phase and an amplitude of the voltage converted into the digital signal and a phase and an amplitude of the current converted into the digital signal; and a third calculator configured to calculate the impedance of the plasma within the chamber based on a phase difference and an amplitude ratio between the voltage converted into the digital signal and the current converted into the digital signal.

3. The plasma processing apparatus of claim 2, wherein the first calculator further includes:

a signal generator configured to generate a sampling clock input into each of the first ADC and the second ADC;

a first phase adjusting unit configured to adjust a phase of the sampling clock input into the first ADC based on the phase of the voltage corresponding to the sampling clock; and a second phase adjusting unit configured to adjust a phase of the sampling clock input into the second ADC based on the phase of the current corresponding to the sampling clock.

4. The plasma processing apparatus of claim 3, wherein the first calculator further includes:

a first amplifier configured to amplify the voltage of the first high frequency power supplied into the chamber and input the amplified voltage into the first ADC;

a second amplifier configured to amplify the current of the first high frequency power supplied into the chamber and input the amplified current into the second ADC;

a first gain adjusting unit configured to adjust a gain of the first amplifier based on the amplitude of the voltage calculated by the second calculator; and a second gain adjusting unit configured to adjust a gain of the second amplifier based on the amplitude of the current calculated by the second calculator.

5. The plasma processing apparatus of claim 2, wherein the first calculator further includes:

a first amplifier configured to amplify the voltage of the first high frequency power supplied into the chamber and input the amplified voltage into the first ADC;

a second amplifier configured to amplify the current of the first high frequency power supplied into the chamber and input the amplified current into the second ADC;

a first gain adjusting unit configured to adjust a gain of the first amplifier based on the amplitude of the voltage calculated by the second calculator; and a second gain adjusting unit configured to adjust a gain of the second amplifier based on the amplitude of the current calculated by the second calculator.

6. The plasma processing apparatus of claim 1, further comprising:

a second measurement unit connected to a node between the power supply unit and the matching circuit and configured to measure a voltage and a current of a second high frequency power output from the power supply unit into the matching circuit, wherein the first calculator calculates the impedance of the plasma within the chamber by further using the voltage and the current of the second high frequency power measured by the second measurement unit.

7. A measurement circuit which is provided in a plasma processing apparatus including a chamber in which an internal space is provided and a processing target object carried into the internal space is processed with a plasma generated in the internal space; a power supply unit configured to supply a high frequency power for plasma generation within the chamber; a matching circuit provided between the chamber and the power supply unit; and a control circuit configured to control a frequency of the high frequency power supplied into the chamber by the power supply unit, a magnitude of the high frequency power, and an impedance of the matching circuit and which is configured to measure an impedance of the plasma within the chamber, wherein the measurement circuit is provided on a single substrate together with the control circuit, and the measurement circuit includes:

a first analog to digital converter (ADC) configured to convert a voltage of the high frequency power supplied into the chamber into a digital signal;

a second ADC configured to convert a current of the high frequency power supplied into the chamber into a digital signal;

an amplitude/phase calculator configured to calculate a phase and an amplitude of the voltage converted into the digital signal and a phase and an amplitude of the current converted into the digital signal; and an impedance calculator configured to calculate the impedance of the plasma within the chamber based on a phase difference and an amplitude ratio between the voltage converted into the digital signal and the current converted into the digital signal.

8. A plasma processing apparatus, comprising:

a chamber in which an internal space is provided and a processing target object carried into the internal space is processed with a plasma generated in the internal space;

a power supply unit configured to supply a first high frequency power for plasma generation within the chamber;

a matching circuit configured to match an impedance of the plasma within the chamber with an impedance of the power supply unit;

a first calculator configured to calculate the impedance of the plasma within the chamber; and a control circuit configured to control a frequency of the first high frequency power supplied into the chamber, a magnitude of the first high frequency power, and an impedance of the matching circuit based on the impedance calculated by the first calculator, wherein the first calculator and the control circuit are provided on a single substrate, and wherein the first calculator includes:

a first analog to digital converter (ADC) configured to convert a voltage of the first high frequency power supplied into the chamber into a digital signal;

a second ADC configured to convert a current of the first high frequency power supplied into the chamber into a digital signal;

a second calculator configured to calculate a phase and an amplitude of the voltage converted into the digital signal and a phase and an amplitude of the current converted into the digital signal; and a third calculator configured to calculate the impedance of the plasma within the chamber based on a phase difference and an amplitude ratio between the voltage converted into the digital signal and the current converted into the digital signal.

9. The plasma processing apparatus of claim 8, wherein the first calculator further includes:

a signal generator configured to generate a sampling clock input into each of the first ADC and the second ADC;

a first phase adjusting unit configured to adjust a phase of the sampling clock input into the first ADC based on the phase of the voltage corresponding to the sampling clock; and a second phase adjusting unit configured to adjust a phase of the sampling clock input into the second ADC based on the phase of the current corresponding to the sampling clock.

10. The plasma processing apparatus of claim 9, wherein the first calculator further includes:

a first amplifier configured to amplify the voltage of the first high frequency power supplied into the chamber and input the amplified voltage into the first ADC;

a second amplifier configured to amplify the current of the first high frequency power supplied into the chamber and input the amplified current into the second ADC;

a first gain adjusting unit configured to adjust a gain of the first amplifier based on the amplitude of the voltage calculated by the second calculator; and a second gain adjusting unit configured to adjust a gain of the second amplifier based on the amplitude of the current calculated by the second calculator.

11. The plasma processing apparatus of claim 8, wherein the first calculator further includes:

a first amplifier configured to amplify the voltage of the first high frequency power supplied into the chamber and input the amplified voltage into the first ADC;

a second amplifier configured to amplify the current of the first high frequency power supplied into the chamber and input the amplified current into the second ADC;

a first gain adjusting unit configured to adjust a gain of the first amplifier based on the amplitude of the voltage calculated by the second calculator; and a second gain adjusting unit configured to adjust a gain of the second amplifier based on the amplitude of the current calculated by the second calculator.

12. The plasma processing apparatus of claim 8, further comprising:

a second measurement unit connected to a node between the power supply unit and the matching circuit and configured to measure a voltage and a current of a second high frequency power output from the power supply unit into the matching circuit, wherein the first calculator calculates the impedance of the plasma within the chamber by further using the voltage and the current of the second high frequency power measured by the second measurement unit.

* * * * *